United States Patent
Yang et al.

(10) Patent No.: US 6,243,795 B1
(45) Date of Patent: Jun. 5, 2001

(54) REDUNDANT, ASYMMETRICALLY PARALLEL DISK CACHE FOR A DATA STORAGE SYSTEM

(75) Inventors: Qing Yang, Wakefield; Yiming Hu, Kingston, both of RI (US)

(73) Assignee: The Board of Governors for Higher Education, State of Rhode Island and Providence Plantations, Providence, RI (US)

(*) Notice: Subject to any disclaimer, the term of this patent is extended or adjusted under 35 U.S.C. 154(b) by 0 days.

(21) Appl. No.: 09/129,042

(22) Filed: Aug. 4, 1998

(51) Int. Cl.[7] .................................................... G06F 12/00
(52) U.S. Cl. ..................... 711/159; 160/114; 160/113; 160/117
(58) Field of Search .................................. 711/105, 119, 711/118, 160, 159, 162, 114, 117; 707/8

(56) References Cited

U.S. PATENT DOCUMENTS

| | | | |
|---|---|---|---|
| 5,341,493 | * 8/1994 | Yanai et al. | 395/425 |
| 5,485,598 | 1/1996 | Kashima et al. | 395/182.04 |
| 5,522,031 | 5/1996 | Ellis et al. | 395/182.04 |
| 5,526,482 | 6/1996 | Stallmo et al. | 395/182.04 |
| 5,535,381 | * 7/1996 | Kopper | 395/600 |
| 5,577,226 | * 11/1996 | Percival | 395/446 |
| 5,588,129 | * 12/1996 | Ballard | 395/440 |
| 5,615,353 | * 3/1997 | Lautzenheiser | 395/463 |
| 5,666,512 | 9/1997 | Nelson et al. | 711/114 |
| 5,689,678 | 11/1997 | Stallmo et al. | 395/441 |
| 5,787,466 | * 7/1998 | Berliner | 711/117 |
| 5,896,492 | * 4/1999 | Chong, Jr. | 395/182.01 |
| 5,909,700 | * 6/1999 | Bitner et al. | 711/162 |
| 6,021,408 | * 2/2000 | Ledain et al. | 707/8 |

\* cited by examiner

*Primary Examiner*—Matthew Kim
*Assistant Examiner*—B. Peugh
(74) *Attorney, Agent, or Firm*—Samuels, Gauthier & Stevens, LLP.

(57) ABSTRACT

A data storage system includes redundant write caches, a disk controller and an array of disks. One of the redundant write caches is a primary write cache of RAM or NVRAM, and another is a backup write cache having a hybrid memory structure of a relatively small amount of NVRAM in combination with a cache-disk space mapped to disk. The cache-disk space may be located on a single disk within the disk array, or distributed over a number of the plurality of disks in the array. In one embodiment, the array of disks can may be configured as a RAID architecture. The data storage system of the present invention preferably employs a conventional, fast-write-fast-read primary write cache and a non-volatile, hybrid memory backup write cache. The redundant write caches are asymmetric since the primary write cache and the backup write cache have different sizes and structures. The system is relatively inexpensive since the amount NVRAM in the backup cache is relatively small, ranging from hundreds of KB to several MB, and the cost of the disk space for the cache-disk space is significantly less than a large amount of NVRAM. Advantageously, the caching arrangement of the present invention has a significant reliability advantage over conventional single NVRAM write caches, and a cost advantage over dual-copy NVRAM caches. In addition, the prevent invention provides a cost-effective architecture for very large write caches capable of masking the effects of small writes for high-end data storage systems that would otherwise have to use dual-copy, identical NVRAM caches.

11 Claims, 7 Drawing Sheets

REDUNDANT, ASYMMETRICALLY PARALLEL DISK CACHE FOR A DATA STORAGE SYSTEM

CROSS REFERENCE TO RELATED APPLICATIONS

This application contains subject matter related to a commonly assigned application designated Ser. No. 08/588,132, U.S. Pat. No. 5,754,888 filed Jan. 18, 1996, entitled "System for Destaging Data During Idle Time By Transferring To Destage Buffer, Marking Segment Blank, Reordering Data In Buffer, and Transferring To Beginning Of Segment". This application is hereby incorporated herein by reference.

GOVERNMENT RIGHTS

This invention was made with government support under Contract MP9505601 awarded by the National Science Foundation. The government may have certain rights in the invention.

TECHNICAL FIELD

The invention relates to the field of redundant data storage systems, and in particular to a data storage system architecture having a redundant, asymmetrical disk cache.

BACKGROUND OF THE INVENTION

A well known disk array system architecture is referred to as "redundant array of independent/inexpensive disks" (RAID). The RAID system architecture provides a large amount of data storage in a reasonably reliable manner. Several popular RAID system architectures are set forth in the paper entitled "A Case for Redundant Arrays of Inexpensive Disks (RAID)", Patterson et al., Proc. ACM SIGMOD, June 1988. These architectures include RAID-1, RAID-2, RAID-3, RAID-4 and RAID-5. U.S. Pat. No. 5,526,482 entitled "Storage Device Array Architecture With Copyback Cache" briefly discusses each of these architectures, and in the interest of brevity a similar discussion will not be repeated herein.

In general, each of the RAID system architectures includes a plurality of disks that are controlled by a RAID disk controller. When a central processing unit (CPU) sends information to the disk controller for storage on disk, the controller directs how the information shall be stored on the plurality of disks to ensure that a failure of any one of the disks will not cause the system to loose information.

Modern disks are impressively reliable, with a Mean Time To Failure (MTTF) of up to about 1 million hours. Such a low failure rate, coupled with the inherent redundancy provided by the RAID system architecture provides a Mean Time To Data Loss (MTTDL) of around several hundreds of millions of hours in a typical RAID-5 system architecture. However, this is not the system MTTDL, since the reliability of the system is only as good as the reliability of its most unreliable component.

Many RAID systems employ a single cache in front of the plurality of disks. However, a single cache creates a single point failure mode which could disable the entire RAID system and cause the loss of data. Typical RAID caches use an NVRAM cache (e.g., battery backed RAM) which has a MTTF of only about 15,000 hours. Therefore, failure of the NVRAM cache results in a significantly higher risk of data loss in comparison to the risk associated with a disk failure.

To overcome this reliability problem, some high-end RAID systems use dual-copy caches (i.e., a primary cache and a backup cache) so a failure in one cache does not cause the loss of data. That is, the other cache is intact which ensures the integrity of the data stored on disk. When a write request arrives from the CPU, the controller writes the data independently into the two caches. Although the use of dual-copy caches overcomes the reliability problem of the single-copy cache, the high cost of NVRAM makes dual-copy caches prohibitively expensive, particularly for large caches.

Therefore, there is a need for a redundant, inexpensive write cache for use in a data storage system, including RAID systems.

SUMMARY OF THE INVENTION

An object of the present invention is to provide a data storage system which employs an inexpensive, redundant write cache.

Briefly, according to the present invention, a data storage system includes redundant write caches, a disk controller and an array of disks. One of the redundant write caches is a primary write cache and another is a backup write cache having a hybrid memory structure comprising a cache-disk space mapped to at least one of the disks.

The cache-disk space may be located on a single disk within the disk array, or distributed over a number of the plurality of disks in the array. In one embodiment, the array of disks may be configured as a RAID architecture.

The data storage system of the present invention preferably employs a conventional, fast-write-fast-read primary write cache and a non-volatile, hybrid memory backup write cache. The backup write cache includes NVRAM, and small and random writes are buffered in a least recently used (LRU) cache located in the NVRAM. If the LRU cache is full, LRU data blocks in the LRU cache are transferred into a segment buffer which is also located in the backup cache NVRAM to make room for new write requests. When the segment buffer is full, its entire contents are written into the cache-disk space. Notably, combining the data from smaller writes into a block of data for a larger write reduces the number of smaller writes, and the segment buffer is quickly made available for additional requests so the two level backup cache appears to a host CPU as a large NVRAM. As a result, the backup write cache may achieve the same write speed as the primary cache.

The redundant write caches are asymmetric since the primary write cache and the backup write cache have different structures.

The system is relatively inexpensive since the amount NVRAM in the backup cache is relatively small, ranging from hundreds of KB to several MB, and the cost of the disk space for the cache-disk space is significantly less than a large amount of NVRAM.

Advantageously, the caching arrangement of the present invention has a significant reliability advantage over conventional single NVRAM write caches, and a cost advantage over dual-copy NVRAM caches. In addition, the present invention provides a cost-effective architecture for very large write caches capable of masking the effects of small writes for high-end data storage systems that would otherwise have to use dual-copy, identical NVRAM caches.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
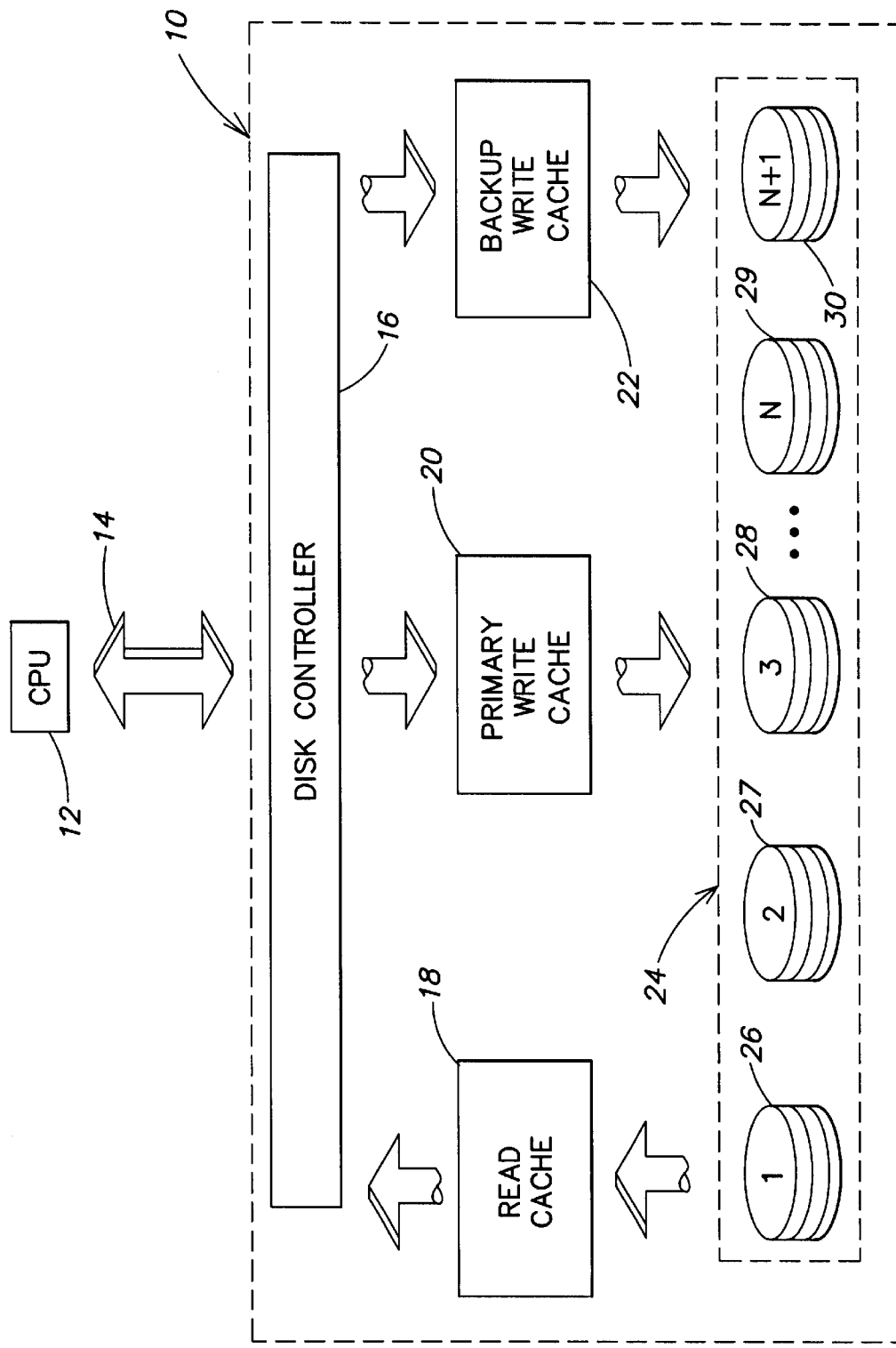
FIG. 1 is a functional block diagram illustration of a data storage system architecture according to the present invention.

FIG. 1 illustrates a functional block diagram of a data storage system 10. The system 10 communicates with a central processing unit (CPU) 12 via a bus 14 (e.g., a small computer systems interface (SCSI) bus). The system 10 includes a controller 16 which communicates with a read cache 18, a primary write cache 20 and a backup write cache 22. During normal operations (i.e., in the absence of a system failure), the primary write cache 20 and the backup write cache 22 contain redundant data. As known, if either of these two caches fails, the data can be reconstructed from the other.

Each of the caches 18, 20, 22 reads data from or writes data to a plurality of disks 26–30. In a preferred embodiment, the plurality of disks 26–30 are configured as a redundant array of independent/inexpensive disks (RAID). However, one of ordinary skill will recognize that the redundant cache architecture of the present invention is applicable to virtually any input/output (I/O) system.

The primary write cache 20 generally employs NVRAM for storage (e.g., battery backed RAM) to ensure data is retained in the event of a power failure (or other system failures). However, to reduce system cost the primary write cache 20 may employ DRAM rather than NVRAM. In contrast, according to the present invention, the backup write cache 22 has a hierarchical, hybrid-memory structure.

Figure 2:
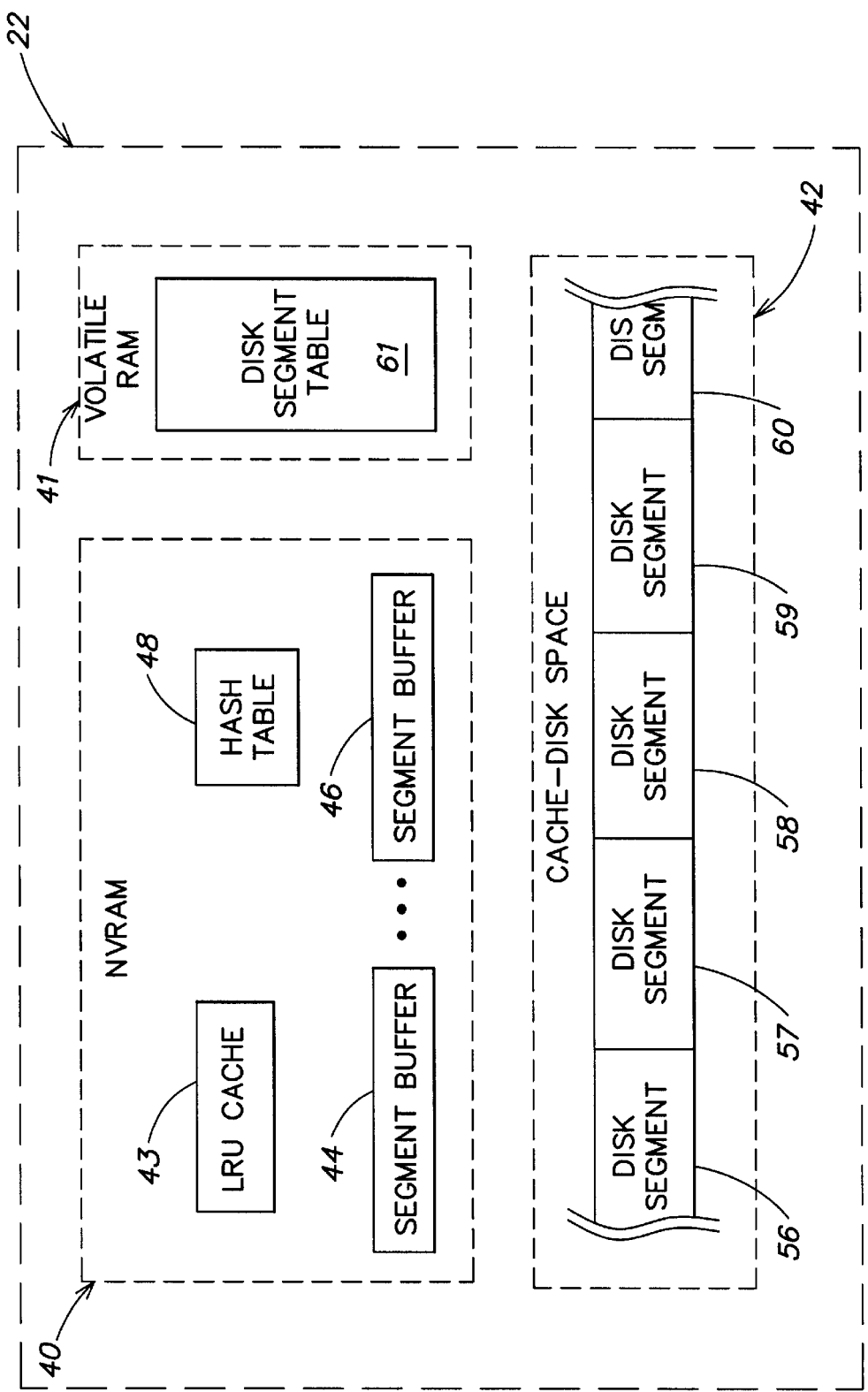
FIG. 2 is a functional block diagram illustration of a backup write cache.

FIG. 2 illustrates a functional block diagram of the backup write cache 22. The cache has a hybrid memory structure that includes NVRAM 40, volatile RAM 41 (preferably DRAM) and a cache-disk space 42. The size of the NVRAM 40 ranges from several hundred kB to several MB in size, while the cache-disk space 42 has the capacity to store about several hundred MB. The sizes discussed herein are used only for their relative sizes, and one of ordinary skill will recognize that the present invention is not limited to the sizes discussed herein.

The backup cache NVRAM 40 is partitioned to provide a last recently used (LRU) cache 43, a plurality of segment buffers 44, 46 and a hash table 48. The recently accessed data resides in the LRU cache 43. The last recently accessed data is kept in the cache-disk space 42, and is preferably organized into a plurality of disk segments 56–60 similar to a log-structured file system such as Sprite LFS and the BSD LFS. Each disk segment 56–60 contains a number of slots each of which can hold one data block. In one embodiment, each block is 32 kb. Data blocks stored in the segments 56–60 are addressed by their segment IDs and slot IDs. Data blocks stored in the LRU cache 43 are addressed by their logical block addresses (LBAs).

The hash table 48 contains location information for each of the valid data blocks in the backup cache 22. Specifically, the location information identifies whether a block is in the LRU cache 43 or in the cache-disk space 42, as well as the address of the information in the LRU cache 43 or the cache-disk space 42.

The backup cache 22 also includes a disk segment table 61 which is preferably located in the volatile RAM 41. The details of the disk segment table 61 shall be discussed below.

Referring to FIGS. 1 and 2, the cache-disk space 42 is preferably physically located on a portion of the disk 30. Significantly, assigning the cache-disk space 32 to disk advantageously implements the cache-disk space 42 without additional system hardware cost, since the plurality of disks 26–30 may include one or more spare disks that are available in the event an active disk fails. In many prior art systems, the spare disks are not used during normal operation and therefore, it is difficult to detect if one of the spares has failed. However, by mapping the cache-disk space 42 to a spare disk (e.g., disk 30) it is easier to detect when the spare disk is working properly, thus reducing the possibility of a latent failure of a spare disk.

When the storage system 10 receives a write request from the CPU 12, the disk controller 16 invalidates any data copy in the read cache 18, and sends the data to be written to both the primary write cache 20 and the LRU cache 43 of the backup write cache 22. If there is space available in the write caches 20, 22, the data is copied to the available space immediately. To indicate that the data block is located in the backup LRU cache 43, the controller 16 creates a hash entry which is stored in the hash table 48. Once the data is written into both the primary write cache 20 and the backup write cache 22, the controller 16 sends an acknowledgment to the CPU 12 signaling that the write request is complete.

If there is no space left in the primary write cache 20, the controller 16 first tries to discard a "clean" block of data from the cache 20 to make room for the new request. A "clean" block of data is defined as a cache resident block of data that has already been successfully copied to disk. However, if the controller 16 cannot find a "clean" block to discard, it executes a foreground destaging process (to be described in detail hereinafter) which writes a least-recently-used data block to the array of disks 24. When the least-recently-used block is safely written into the array of disks 24, the space that was used for the least-recently-used data block in the primary write cache 20 is freed for the incoming request. The controller 16 also invalidates the associated data in the backup write cache 22.

If the backup cache 22 is full (i.e., the LRU cache 43 is full), the controller 16 selects an empty one of the segment buffers 44, 46 and designates it as the "current" segment buffer. An LRU cache resident data block is then copied to the "current" segment buffer and the corresponding entries in the hash table 48 and the disk segment table 50 are modified to indicate that the data block is now in the "current" segment buffer. The disk segment table 50 contains information regarding which slots and disk segments are free, and can be used to cache data. Space within the LRU cache 43 is then available to accept incoming requests. Subsequent write requests may continue to evict least-recently-used blocks from the LRU cache 43 and transfer the blocks to the "current" segment buffer until it is full. Once the "current" segment buffer is full, the controller 16 designates another segment buffer as the "current" segment buffer and continues to accept data from the LRU cache 43. The controller then writes the contents of the full segment buffer into the cache-disk space 42, preferably in one large write during background.

Since the full segment buffer is written to the cache-disk space 42 in one large write instead of many small writes, the full segment buffer is quickly again made available when the disk write finishes. Therefore, the NVRAM 40 and the cache-disk space 42 of the backup write cache 22 collectively appear to the controller 16 as a large uniform NVRAM write cache, whose write performance is analogous to the primary write cache 20.

The size of the NVRAM resident segment buffers 44, 46 directly affects the write efficiency. That is, the larger the segment buffers 44, 46, the smaller the write overheads caused by disk seeking and rotational latencies. However, for a given NVRAM size, as the size of the segment buffers 44, 46 increases, the smaller the LRU cache 43 becomes since the segment buffers 44, 46 and the LRU cache 43 are both physically resident in NVRAM. Therefore, there is a trade-off between segment buffer size and LRU cache size.

When the controller 16 receives a read request from the CPU 12, the read cache 18 and the primary write cache 20 are searched. If there is a cache hit, the data is immediately read. However, if there is a cache miss, the LRU block (not shown) in the read cache 18 is discarded and its buffer space is freed. The requested data is then read from the array of disks 24 and stored in the freed LRU block of the read cache 18. The backup cache 22 is generally not involved in read operations.

As discussed briefly discussed above, the destaging process involves moving "dirty" data resident in the primary write cache 20 to disk. Dirty data is defined as data that is stored in the primary write cache, but not yet stored in disk. Destaging is performed in background when the controller 16 detects an idle period, or when the number of "dirty" blocks in the primary write cache 20 exceeds a predetermined value (i.e., a high water mark).

Figure 3:
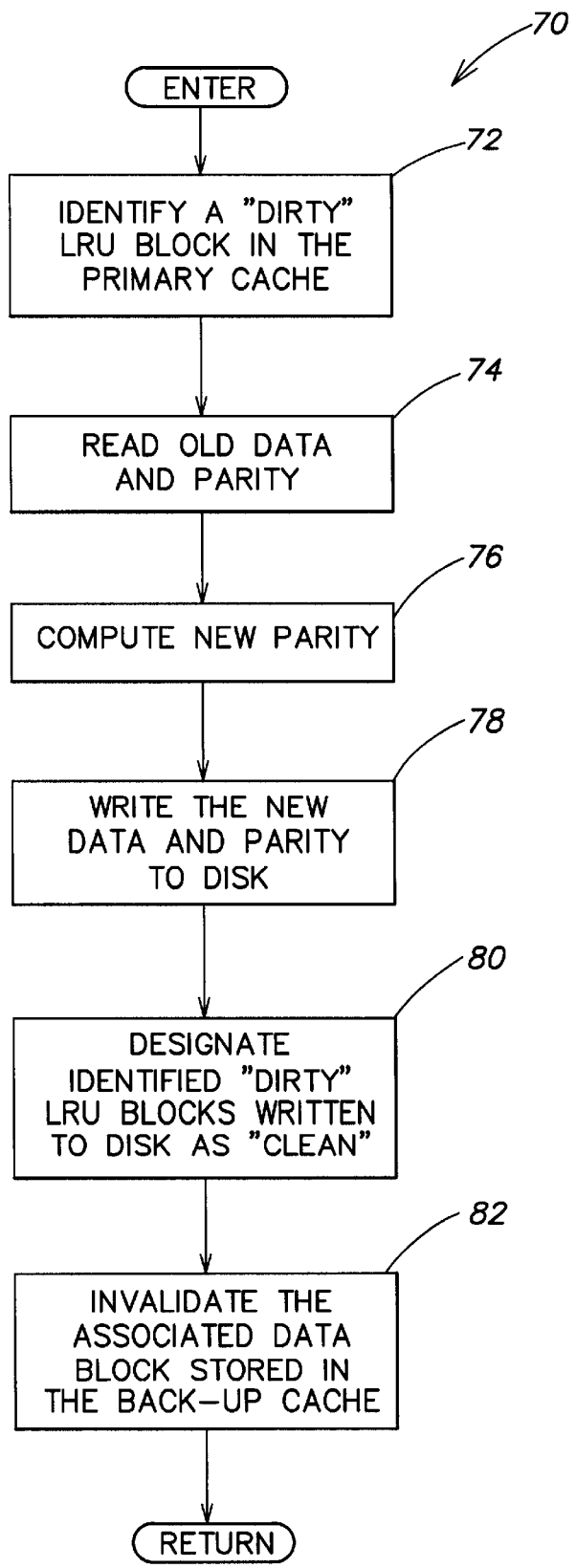
FIG. 3 is a flow chart illustration of the processing steps associated with the destaging process.

FIG. 3 is a flow chart illustration of processing steps 70 associated with the destaging process. This process 70 is executed by the controller regularly in background, and on an as-needed-basis in foreground. Upon entry to the process 70, the controller 16 (FIG. 1) executes step 72 to identify "dirty" blocks of data resident in the primary write cache 20 (FIG. 1). Step 74 is then executed to read the old data and the parity value associated with the old data. The old data and the old parity value are read from disk. A new parity value based upon the identified "dirty" data and the old data is then computed in step 76, and the new data and parity value are written to the plurality of disks 24 in step 78. To indicate that the data is now resident in disk, step 80 is performed to designate the blocks of data that were written to disk in step 78 as "clean". The controller 16 (FIG. 1) then executes step 82 to invalidate the copy of the data stored in the backup write cache 22 (FIG. 1) that is identical to the data written to disk in step 78.

If the data to be invalidated in the backup write cache 22 is resident in the NVRAM LRU buffer 43, the controller releases the LRU buffer 43 as necessary. However, if the data to be invalidated is resident in one of the segment buffers 44, 46, or one of the disk segments 56–60, the controller 16 invalidates the data by marking the corresponding segment slot stored in the disk segment table 61 (FIG. 2) as "invalid". The controller 16 also deletes the corresponding hash entry resident in the hash table 48.

During background the destaging process 70 preferably runs continuously until the controller processing returns to foreground. Alternatively, the destaging process may only run continuously during background until the number of dirty blocks in the primary cache falls below the predetermined low water-mark. During background the controller may also execute known tasks such as built-in-test (BIT).

During foreground the destaging process 70 is called when the controller 16 (FIG. 1) receives a new write request and the entire primary write cache 20 is occupied by "dirty" data. This may occur when a large write overflows the primary write cache 20. In this case, the destaging process 100 (FIG. 3) is initiated to free space for the incoming request.

Notably, the backup cache is not read or written to during either the background or foreground destaging process. Therefore the slower read speed the cache-disk will not affect the destaging performance.

Figure 4:
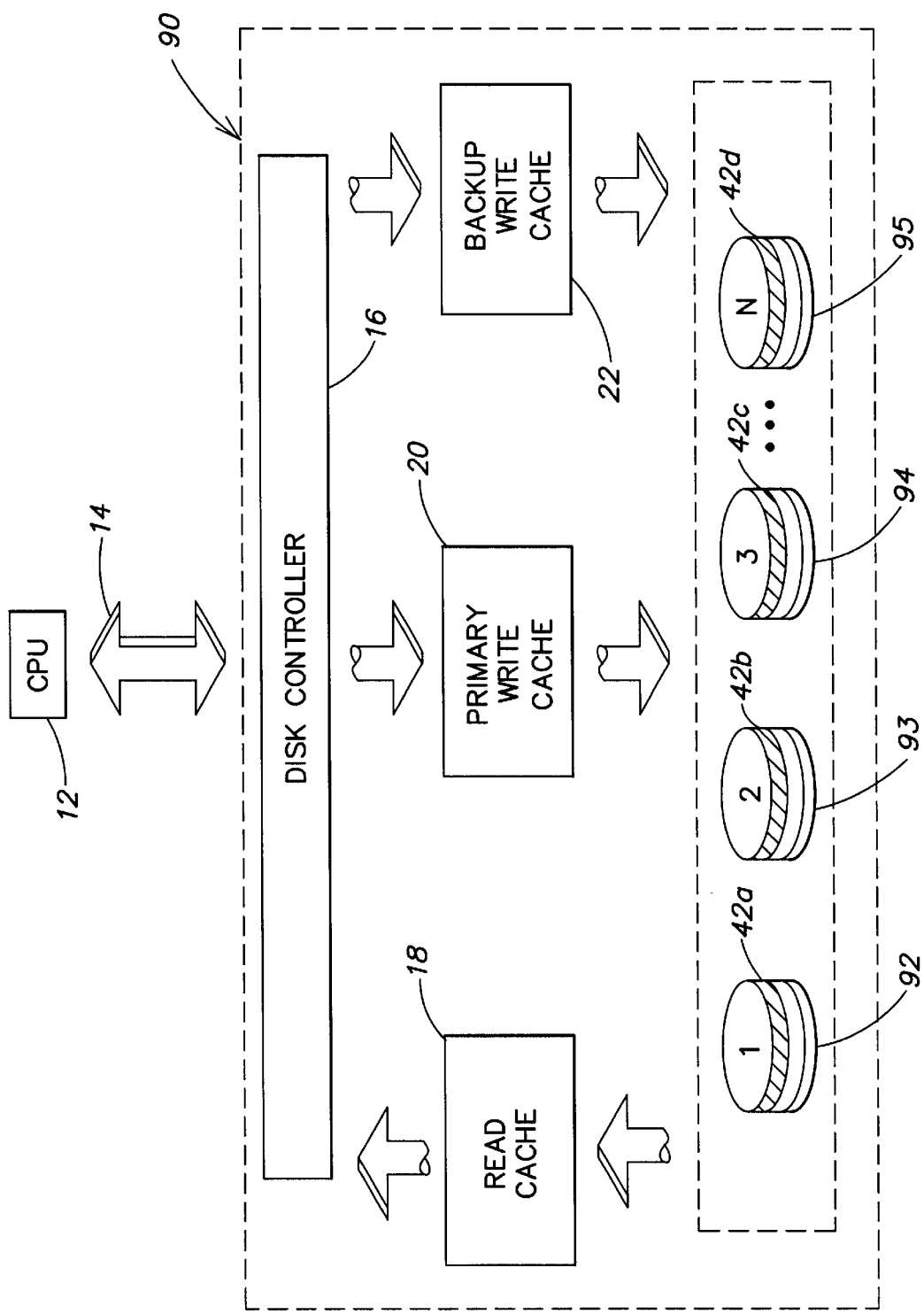
FIG. 4 is a functional block diagram illustration of an alternative embodiment data storage system.

FIG. 4 illustrates a functional block diagram of an alternative embodiment data storage system 90. This alternative embodiment system 90 is substantially the same as the system 10 illustrated in FIG. 1, with the principal exception that the cache-disk space 42 (FIG. 2) is mapped into a plurality of disks 92–95, rather than one disk (e.g., disk 30—FIG. 1). Specifically, the cache-disk space 42 is logically partitioned into sub-spaces that are distributed over the plurality of disks 92–95.

Figure 5:
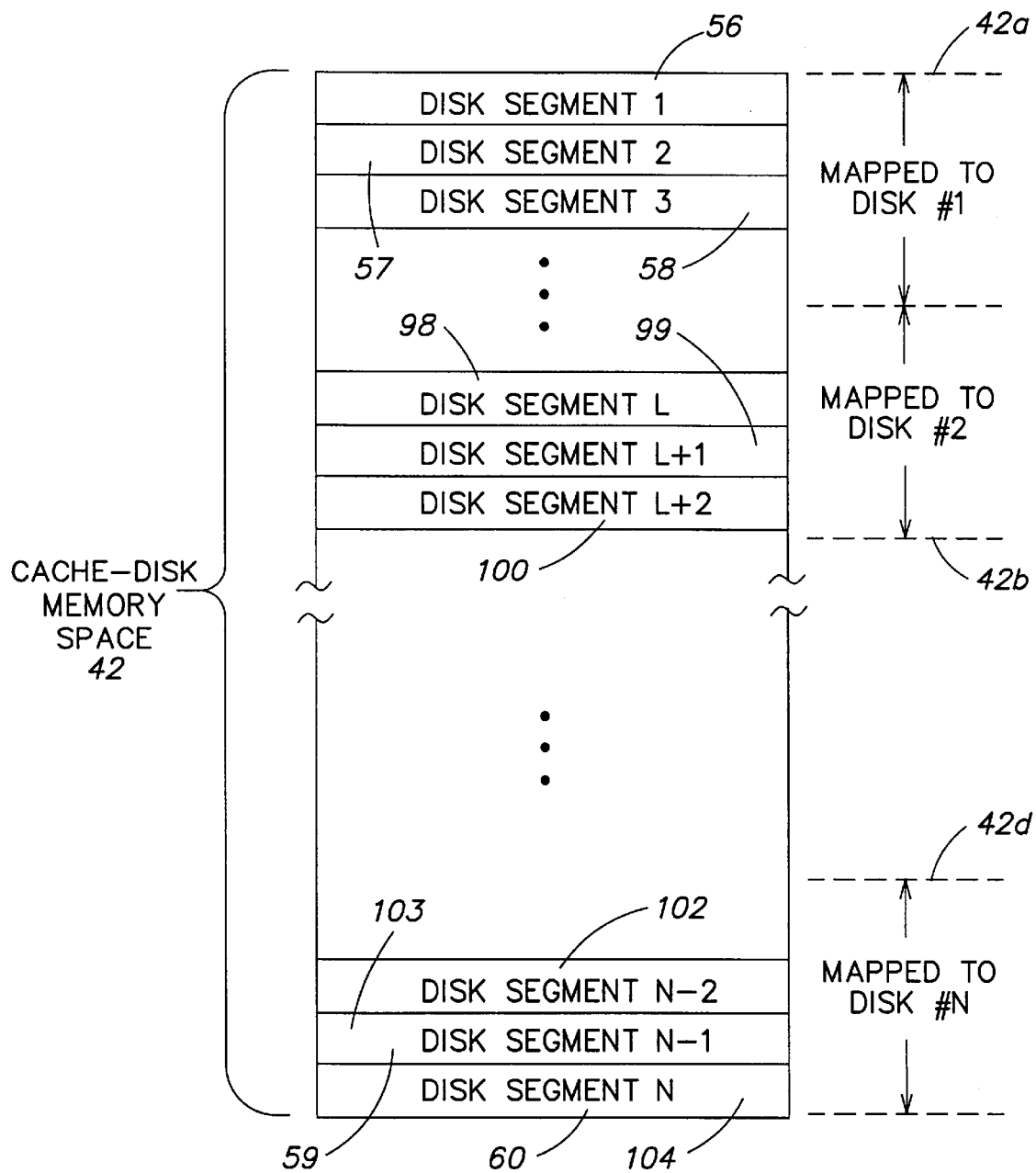
FIG. 5 is a pictorial illustration of the cache-disk memory space.

Referring to FIG. 5, the cache-disk space 42 includes a plurality of sub-spaces 42a–42d that are mapped into the plurality of the disks. For example, the first sub-space 42a which includes a first plurality of disk segments 56–58, is mapped to disk #1 92 (FIG. 4). The second sub-space 42b includes a second plurality of disk segments 98–100 and is mapped to disk #2 93 (FIG. 4). Similarly, cache disk sub-space 42d includes a plurality of segments 102–104 and is mapped to disk #N 95 (FIG. 4). As a result, the cache-disk space 42 is subdivided and mapped into the plurality of disks 93–95 (FIG. 4).

The controller 16 may automatically reconfigure the system 10 illustrated FIG. 1 to the system 90 in FIG. 4 if the spare disk 30 (FIG. 1) becomes an active disk due to a disk failure. Specifically, the controller reconfigures the backup write cache 42 to operate using a logical cache-disk space that is partitioned into subspaces and mapped into the active disks since the dedicated spare disk may no longer be available. When using the logical cache-disk space, the data written into the cache partitions on the disks do not involve in parity operations.

For a system with a logical cache-disk (rather than a dedicated physical cache disk), the segment buffer size can not be too large because segment writes must compete with normal reads in data disks. Large segment buffer sizes may result in lower read performance. Computer based simulations have shown that using four 128 KB segment buffers achieves good system performance.

Figure 6:
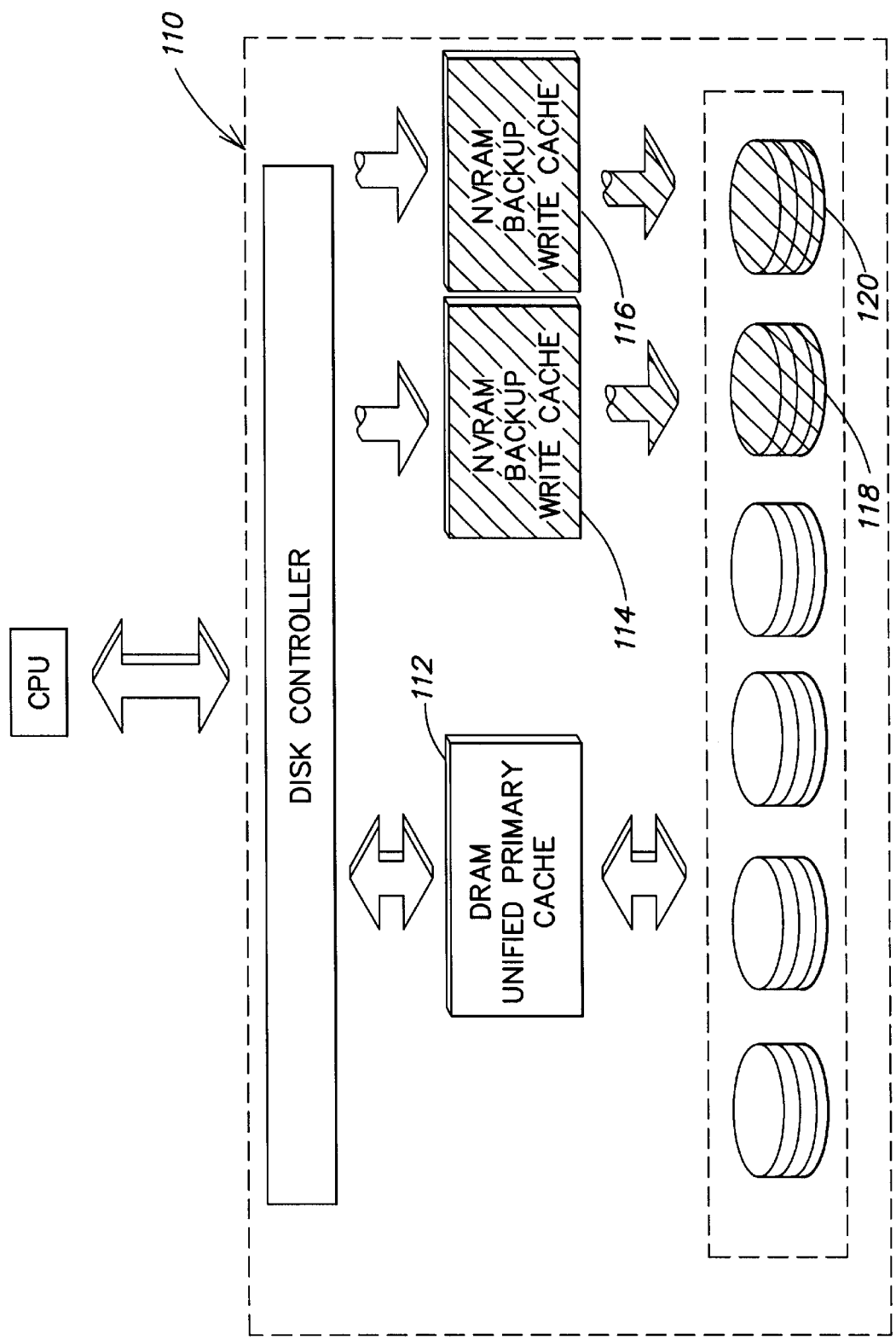
FIG. 6 illustrates a triple redundant data storage system.

FIG. 6 illustrates another alternative embodiment data storage system 110. This data storage system is triple redundant system. Specifically, the system includes a primary cache 112 and two backup caches 114,116. During normal operation the primary cache 112 and the two backup caches 114,116 provide triple redundancy protection. Notably, since the back-up caches 114,116 include non-volatile memory, they provide dual redundancy in the event of a power failure. In this embodiment, dedicated cache disks 118, 120 cooperate with the backup write caches 114,116 respectively.

Figure 7:
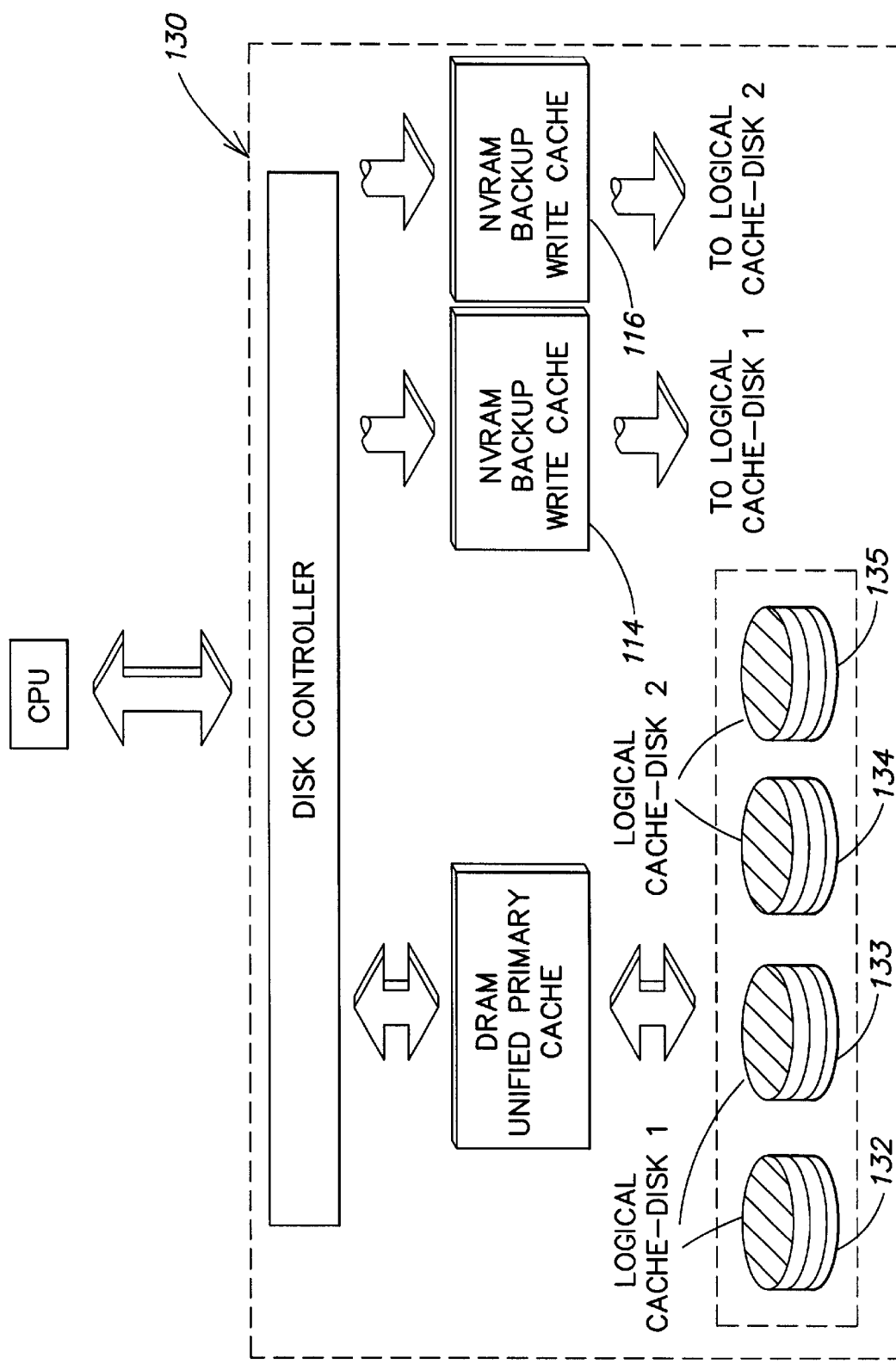
FIG. 7 illustrates yet another triple data storage system.

FIG. 7 illustrates yet another alternative embodiment data storage system 130. This system 130 is substantially the same as the system 110 illustrated in FIG. 7, with the principal exception that the cache-disk space is mapped into a plurality of disks 132–135.

Although one destaging process has been described, one of ordinary skill will recognize that other techniques such as a known linear threshold scheduling algorithm may also be used.

Although the present invention has been shown and described with respect to several preferred embodiments thereof, various changes, omissions and additions to the form and detail thereof, may be made therein, without departing from the spirit and scope of the invention.

What is claimed is:

1. A data storage system which receives data from and provides data to a central processing unit (CPU), the system comprising:

a disk controller which receives data from the CPU;

a plurality of disks;

a primary write cache which receives write data to be written to said plurality of disks; and a backup write cache which also receives said write data and writes said data to backup cache disk space located on at least one of said plurality of disks, wherein said backup write cache also comprises NVRAM that is sub-divided to provide an LRU buffer, a hash table and a plurality of segment buffers.

2. The system of claim 1, wherein said primary write cache includes significantly more RAM than said backup write cache.

3. The system of claim 1, wherein said backup cache disk space is located on one of said plurality of disks.

4. The system of claim 1, wherein said cache-disk space is located on more than one of said plurality of disks.

5. The system of claim 1, wherein said backup write cache further comprises a disk segment table.

6. The system of claim 5, wherein said disk segment table is located in a random array of memory separate from said LRU buffer.

7. The system of claim 6, wherein said disk segment table is stored in DRAM.

8. The system of claim 2, wherein said primary write cache RAM comprises NVRAM.

9. The system of claim 2, wherein said primary write cache RAM comprises DRAM.

10. A redundant, asymmetrical disk cache for a data storage system that includes a disk controller and a plurality of disks, said disk cache comprising:

a primary write cache which receives data to be written to the disks; and a backup write cache which also receives the data to be written to disk, wherein said backup write cache includes a hybrid memory structure comprising a cache-disk space which is mapped into the disk, wherein said backup write cache further comprises NVRAM that is partitioned to provide an LRU cache, a hash value table and a plurality of segment tables.

11. The data storage system of claim 10, wherein said cache-disk space is partitioned into subspaces and mapped into a plurality of disks.

* * * * *